US012804867B2

(12) United States Patent
Huang et al.

(10) Patent No.: US 12,804,867 B2
(45) Date of Patent: Nov. 17, 2026

(54) CIRCUIT BOARD ASSEMBLY AND FABRICATING METHOD OF THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventors: Zhi-Yong Huang, Hebei Province (CN); Feng-Mei Liu, Hebei Province (CN); Xiao-Long Huang, Hebei Province (CN); Wen-Hao Su, Hebei Province (CN)

(73) Assignees: Hong QiSheng Precision Electronics (QinHuangdao) Co., Ltd., Qinhuangdao (CN); Avary Holding (Shenzhen) Co., Ltd., Shenzhen (CN); Garuda Technology Co., Ltd., New Taipei City (TW)

( * ) Notice: Subject to any disclaimer, the term of this patent is extended or adjusted under 35 U.S.C. 154(b) by 207 days.

(21) Appl. No.: 18/787,349

(22) Filed: Jul. 29, 2024

(65) Prior Publication Data

US 2026/0032878 A1 Jan. 29, 2026

(51) Int. Cl.
*H05K 1/18* (2026.01)
*H05K 1/02* (2006.01)
(Continued)

(52) U.S. Cl.
CPC ......... *H05K 9/0024* (2013.01); *H05K 1/0243* (2013.01); *H05K 1/115* (2013.01);
(Continued)

(58) Field of Classification Search
CPC .... H05K 9/0024; H05K 1/0243; H05K 1/115; H05K 1/185; H05K 3/0047; H05K 3/22; H05K 3/30; H05K 2201/0707
(Continued)

(56) References Cited

U.S. PATENT DOCUMENTS

2022/0037270 A1* 2/2022 Wei ........................ H10W 44/20
2023/0156909 A1* 5/2023 Cheng .................... H05K 1/024
174/262
2023/0268256 A1* 8/2023 Wang .................. H10W 70/614
257/690

FOREIGN PATENT DOCUMENTS

CN 107688763 B 9/2022
CN 118160415 A 6/2024
(Continued)

*Primary Examiner* — Binh B Tran
(74) *Attorney, Agent, or Firm* — MUNCY, GEISSLER, OLDS & LOWE, P.C.

(57) ABSTRACT

A circuit board assembly and a fabricating method of the same are provided. The circuit board assembly includes a wiring board and a shielding structure. The wiring board includes a dielectric layer, a wiring layer, a metal film and a metal cover. The first wiring layer includes an antenna. The shielding structure is disposed in the wiring board. The metal film covers a part of the shielding structure, and the metal cover touches the metal film and covers another part of the shielding structure not covered by the metal film. The dielectric layer and the wiring layer are in stacks while the dielectric layer is located on one side of the shielding structure. A material of the shielding structure includes carbon nanotube, metal and resin while the carbon nanotube and the metal are distributed in the resin.

16 Claims, 11 Drawing Sheets

(51) Int. Cl.

| | |
|---|---|
| ***H05K 1/11*** | (2006.01) |
| ***H05K 1/185*** | (2026.01) |
| ***H05K 3/00*** | (2006.01) |
| ***H05K 3/22*** | (2006.01) |
| ***H05K 3/30*** | (2006.01) |
| ***H05K 9/00*** | (2006.01) |

(52) U.S. Cl.
CPC ........... *H05K 1/185* (2013.01); *H05K 3/0047* (2013.01); *H05K 3/22* (2013.01); *H05K 3/30* (2013.01); *H05K 2201/0707* (2013.01)

(58) Field of Classification Search
USPC .......................................................... 361/761
See application file for complete search history.

(56) References Cited

FOREIGN PATENT DOCUMENTS

| | | | |
|---|---|---|---|
| TW | 201444175 | A | 11/2014 |
| TW | 202306457 | A | 2/2023 |

* cited by examiner

CIRCUIT BOARD ASSEMBLY AND FABRICATING METHOD OF THE SAME

BACKGROUND

Field of Invention

The present application relates to a printed circuit board and manufacture of an assembly of electrical components, and more particularly, relates to a circuit board assembly and a fabricating method of the same.

Description of Related Art

General electronic products with communication functions have antennas placed inside them, in which the antennas are usually located on the circuit boards. However, when the antennas receive or transmit electromagnetic waves, the antennas interfere with integrated circuits (chips) or electronic components on the circuit boards in operation. On the other hand, electric signals generated by the chips or the electronic components on the circuit boards also interfere with antennas in operation. There is a technology which manufactures air cavities in the circuit boards presently, and the circuit boards avoid signal interference by the air cavities. That is, the air cavities can inhibit unwanted signals that affect normal signals. However, an effect of the air cavities shielding the signal interference is limited, and the air cavities cause the circuit board warping. In addition, a process of manufacturing the air cavities requires precise alignment so that the process of manufacture is more difficult.

SUMMARY

At least one embodiment of the application provides a circuit board assembly and a fabricating method of the same, in which a shielding structure shields the signal interference between an antenna and a chip, thereby enhancing the signal transmission of the antenna.

The circuit board assembly provided by the at least one embodiment of the application includes a wiring board and a shielding structure. The wiring board includes a dielectric layer, a wiring layer, a metal film and a metal cover. The first wiring layer includes an antenna. The shielding structure is disposed in the wiring board. The metal film covers a part of the shielding structure, and the metal cover touches the metal film and covers another part of the shielding structure which is not covered by the metal film. The dielectric layer and the wiring layer are in stacks while the dielectric layer is located on one side of the shielding structure. A material of the shielding structure includes carbon nanotube, metal and resin while the carbon nanotube and the metal are distributed in the resin. A vertical projection of the antenna and a vertical projection of the shielding structure overlap.

The fabricating method of the circuit board assembly provided by the at least one embodiment of the application includes: providing a wiring substrate; forming a space in a surface of the wiring substrate; forming a metal film on an inner surface that defines the space; forming a shielding structure in the space; disposing a metal cover to cover the shielding structure; providing a metal substrate, in which the metal substrate includes a dielectric layer and a metal layer in stacks; combining the wiring substrate and the metal substrate, in which the dielectric layer faces the metal cover; and patterning the metal layer to form an antenna, in which a vertical projection of the antenna and a vertical projection of the shielding structure overlap.

Based on the above, in the circuit board assemblies applied for above embodiments, the shielding structure shields the signal interference between the antenna and the chip, thereby enhancing the signal transmission of the antenna.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
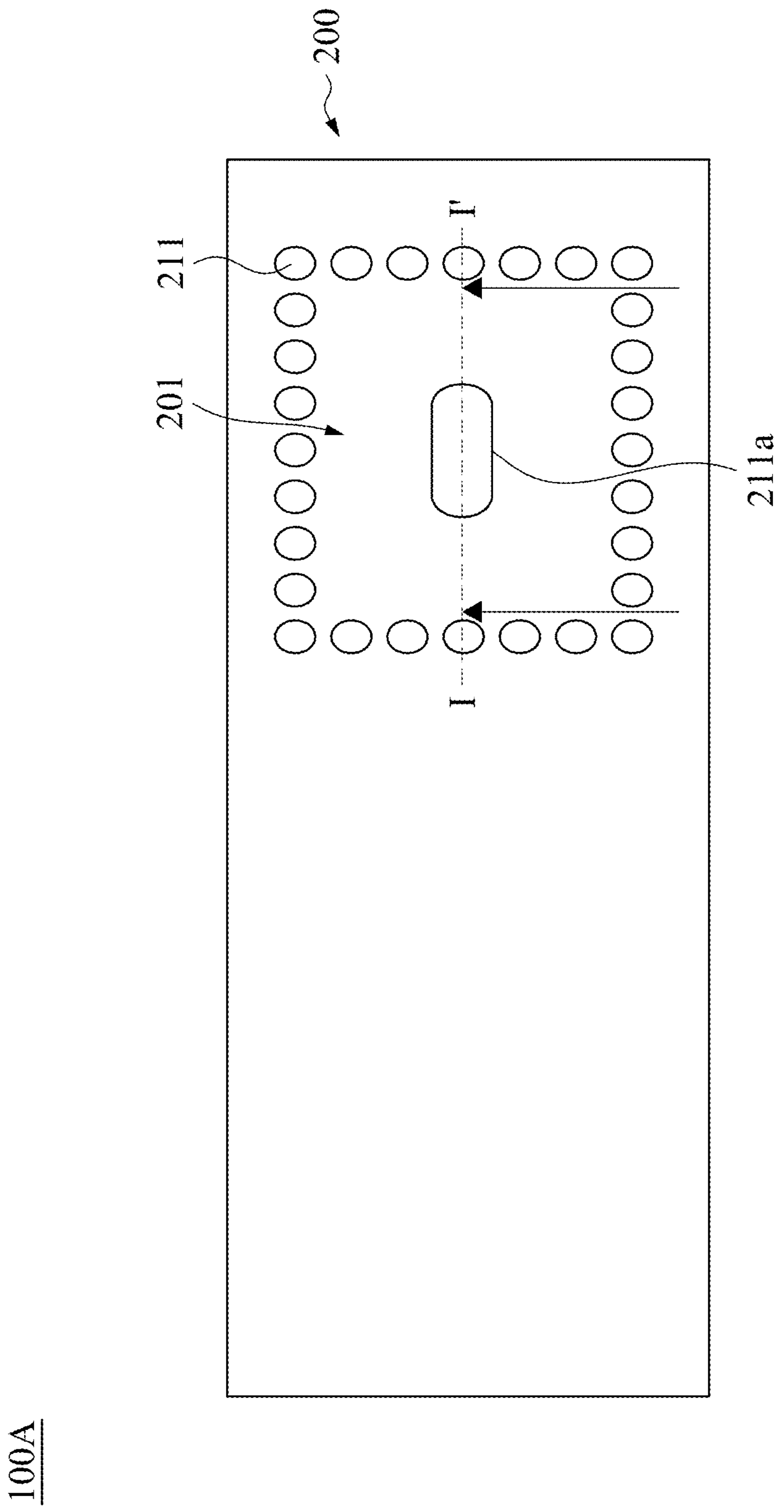
FIG. 1 is a top view of a circuit board assembly according to at least one embodiment of the application.

Reference will now be made in detail to the present embodiments of the invention, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantities, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties. In addition, in order to clearly illustrate following examples, the components with the same or similar features are denoted by the same reference characters.

Figure 2:
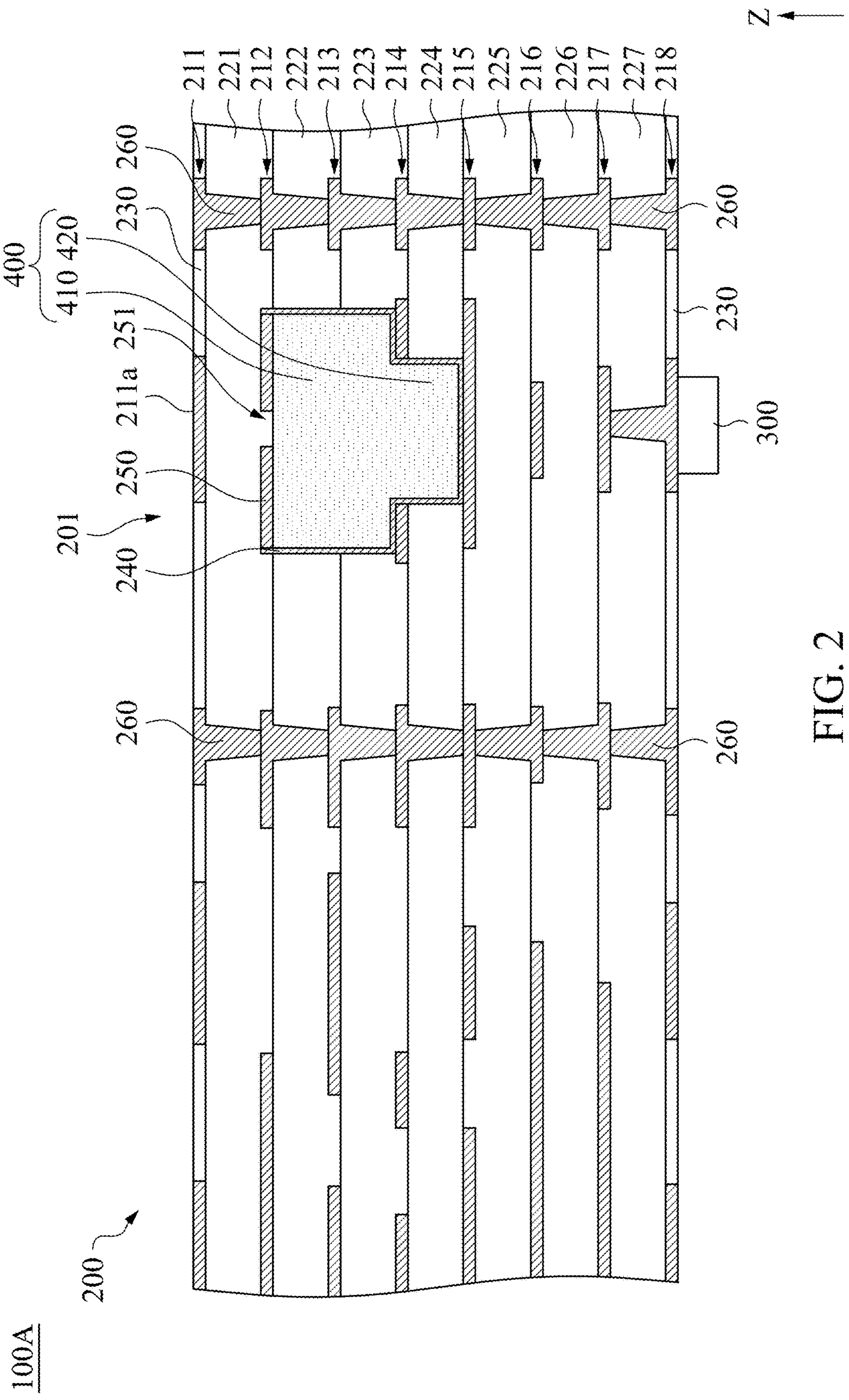
FIG. 2 is a partial cross-sectional diagram along line I-I' in FIG. 1.

FIG. 1 is a top view of a circuit board assembly 100A according to at least one embodiment of the application, and FIG. 2 is a partial cross-sectional diagram along line I-I' in FIG. 1. Referring to FIGS. 1 and 2, the circuit board assembly 100A includes a wiring board 200, a chip 300 and a shielding structure 400.

The wiring board 200 is a multilayer wiring board. The wiring board 200 includes multiple layers of wiring layers 211~218, multiple layers of dielectric layers 221~227, multiple layers of solder masks 230, a metal film 240 and a metal cover 250. For example, the wiring board 200 includes eight layers of wiring layers 211~218 and seven layers of dielectric layers 221~227, but the embodiments of the application are not limited thereto. The dielectric layers 221~227 and the wiring layers 211~218 are in stacks. The dielectric layer 221 is sandwiched between the adjacent wiring layers 211 and 212. The dielectric layer 222 is sandwiched between the adjacent wiring layers 212 and 213. The dielectric layer 223 is sandwiched between the adjacent wiring layers 213 and 214. The dielectric layer 224 is sandwiched between the adjacent wiring layers 214 and 215. The dielectric layer 225 is sandwiched between the adjacent wiring layers 215 and 216. The dielectric layer 226 is sandwiched between the adjacent wiring layers 216 and 217. The dielectric layer 227 is sandwiched between the adjacent wiring layers 217 and 218.

Furthermore, the wiring board 200 has a shielding area 201. The wiring layer 211 includes an antenna 211*a*, and the antenna 211*a* is located in the shielding area 201. The two solder masks 230 are respectively located on top surface and bottom surface of the wiring board 200. For example, the solder masks 230 touch the top surface of the dielectric layers 221 and 227, and chip pads and component pads of the wiring layers 211 and 218 are exposed. In some other embodiments, the solder masks 230 may not touch the chip pads and the component pads of the wiring layers 211 and 218. The metal film 240 and the metal cover 250 are disposed in the wiring board 200.

Figure 3:
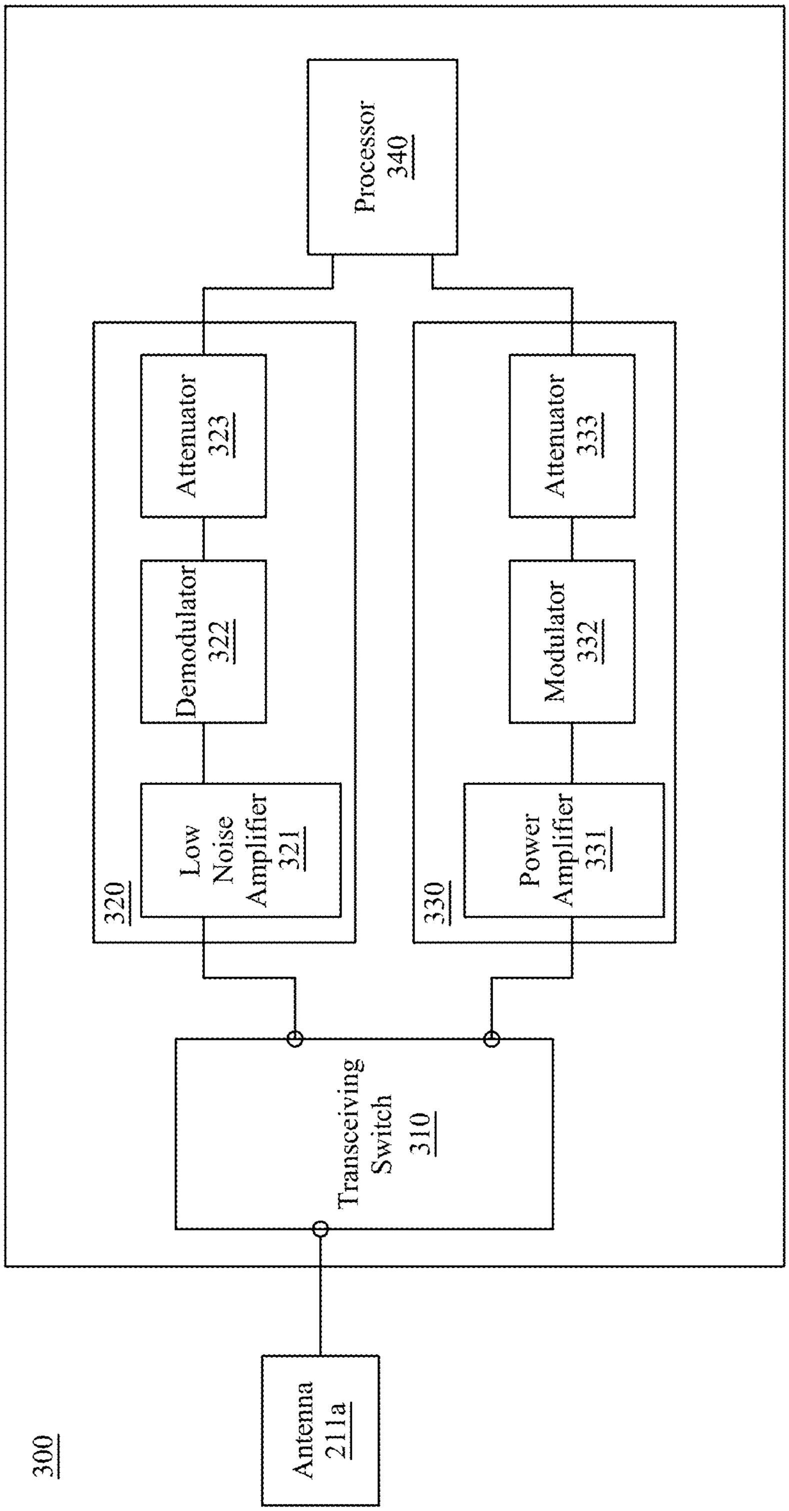
FIG. 3 is a block diagram that an antenna and a chip perform signal transmission in FIG. 2.

FIG. 3 is a block diagram that the antenna 211*a* and the chip 300 perform signal transmission in FIG. 2. Referring to FIGS. 2 and 3, the chip 300 is mounted to the wiring layer 218. The chip 300 may be a radio frequency chip used for controlling the antenna 211*a*. The chip 300 is coupled to the antenna 211*a* (It is not illustrated that the chip 300 is coupled to the antenna 211*a* in FIG. 2), and includes a transceiving switch 310, a receiver circuit 320, a transmitter circuit 330 and a processor 340. The transceiving switch 310 is connected to the antenna 211*a*, and periodically switches the antenna 211*a* to conduct the receiver circuit 320 or the transmitter circuit 330. The receiver circuit 320 and the transmitter circuit 330 are all electrically connected to the processor 340. The receiver circuit 320 and the transmitter circuit 330 may be tuned radio frequency (TRF) components.

The receiver circuit 320 may include a low noise amplifier 321, a demodulator 322 and an attenuator 323, but the embodiments of the application are not limited thereto. When electromagnetic waves need to be received, the transceiving switch 310 switches the antenna 211*a* to conduct the receiver circuit 320. The antenna 211*a* receives the electromagnetic waves and converts them into high frequency electrical signals, and transmits the high frequency electrical signals to the receiver circuit 320. In the receiver circuit 320, at first, the high frequency electrical signals are amplified amplitude through the low noise amplifier 321. Then, the high frequency electrical signals are demodulated to intermediate frequency electrical signals through the demodulator 322. The intensity of the intermediate frequency electrical signals may be lowered through the attenuator 323 before the intermediate frequency electrical signals are transmitted to the processor 340. The processor 340 demodulates the intermediate frequency electrical signals to base band electrical signals and filters them after receiving the intermediate frequency electrical signals. The base band electrical signals may be transmitted to other electronic components to perform sequence processes.

The transmitter circuit 330 may include a power amplifier 331, a modulator 332 and an attenuator 333, but the embodiments of the application are not limited thereto. When electromagnetic waves need to be transmitted, the transceiving switch 310 switches the antenna 211*a* to conduct the transmitter circuit 330. The processor 340 modulates base band electrical signals to intermediate frequency electrical signals, and transmits the intermediate frequency electrical signals to the transmitter circuit 330. In the transmitter circuit 330, at first, the intensity of the intermediate frequency electrical signals may be lowered through the attenuator 333, and then, the intermediate frequency electrical signals are transmitted to the modulator 332. Then, the intermediate frequency electrical signals are modulated to high frequency electrical signals through the modulator 332. The high frequency electrical signals are transmitted to the antenna 211*a* after being amplified power through the power amplifier 331. The antenna 211*a* converts the high frequency electrical signals into the electromagnetic waves and transmits the electromagnetic waves.

The shielding structure 400 disposed in the wiring board 200 is used for shielding the signal interference between the antenna 211*a* and the chip 300 or between the antenna 211*a* and other electronic components. The metal film 240 covers the part of the shielding structure 400, and the metal cover 250 touches the metal film 240 and covers another part of the shielding structure 400 which is not covered by the metal film 240. The metal film 240 and the metal cover 250 may touch the shielding structure 400. The metal cover 250 is used for supporting the shielding structure 400 and structures on the shielding structure 400 (e.g., the wiring layer 211, the dielectric layer 221, and the solder mask 230) to increase the structure strength of the circuit board assembly 100A. In addition, the metal film 240 and/or metal cover 250 may be connected to ground planes in the wiring layers 211~218. The metal film 240 and the metal cover 250 are not connected to surrounding signal paths to avoid a short circuit formed in the circuit board assembly 100A.

The shielding structure 400 may pass through at least two layers of the wiring layers 211~218 and at least two layers of the dielectric layers 221~227, in which the wiring layer 211 and the dielectric layer 221 are located on one side of the shielding structure 400, while the wiring layer 218 is located on another side of the shielding structure 400. For example, in FIG. 2, the wiring layer 211 and the dielectric layer 221 are located on top side of the shielding structure 400, while the wiring layer 218 is located on bottom side of the shielding structure 400. The chip 300 (located in the wiring layer 218) and the antenna 211*a* (located in the wiring layer 211) are respectively located on different sides of the shielding structure 400. For example, the chip 300 and the antenna 211*a* are located on two opposite sides of the wiring board 200. Specially, a vertical projection of the antenna 211*a* (i.e., projecting the antenna 211*a* in direction Z) and a vertical projection of the shielding structure 400 (i.e., projecting the shielding structure 400 in direction Z) overlap.

The shape of the shielding structure 400 may be a cuboid, a cube, a cylinder, a truncated cone, a truncated pyramid or other appropriate shape. That is, the width of the shielding structure 400 in direction Z (e.g., the direction in which the wiring layers 211~218 are stacked) gradually increases, gradually decreases, or remains constant.

In addition, the shielding structure 400 may also include a first component 410 and a second component 420, in which the first component 410 and the second component 420 are in stacks. The width of the first component 410 keeps constant, and the width of the second component 420 keeps constant, and the widths of the first component 410 and the second component 420 are different. The shielding structure 400 increases the contact areas of the wiring board 200 by different widths of the first component 410 and the second component 420, thereby enhancing the bonding force between the shielding structure 400 and the wiring board 200.

Further, materials of the shielding structure 400 include a composite material and resin. The composite material may include carbon nanotube and metal. The carbon nanotube and the metal are in a particular state and are distributed in the resin. The metal may be an iron group, an oxide of the iron group (e.g., iron hydroxide), copper, and/or copper oxide, and size of metal particles may be in nanometers. In some other embodiments, the composite material further includes ceramic material. The ceramic material may be in a particular state and size of the ceramic material may be in nanometers, such as silicon carbide whiskers or nano silicon carbide particles. When a total amount of the shielding structure 400 is 100 wt % (weight percent), an usage amount of the composite material is between 0.1 wt % and 20 wt %, and an usage amount of the resin is between 80 wt % and 99 wt %.

In detail speaking, the shielding structure 400 may reflect the electromagnetic waves and absorb them to obtain effects for shielding the signal interference, in which the carbon nanotube, the metal and the ceramic material have good electrical and thermal conductivities. Specially, because carbon nanotube particles, the metal particles and ceramic material particles have sizes in nanometer range, increased surface areas of the carbon nanotube particles, the metal particles and the ceramic material particles reflect the electromagnetic waves more easily. When the shielding structure 400 contacts the signal interference (i.e., the shielding structure 400 contacts the electromagnetic waves generated by the signal interference), free electrons in the shielding structure 400 are moved by an electric field of the signal interference to form an electric field opposite to the electric field of the signal interference, which decrease the electric field of the signal interference, thereby absorbing the electromagnetic waves of the signal interference. In addition, the shielding structure 400 also conducts heat well. In this way, the shielding structure 400 may convert the energy of the signal interference into heat, and then conduct the heat to elsewhere for good dissipation. The shielding structure 400 has better effects for reflecting and absorbing the electromagnetic waves than air.

Further, the width of the first component 410 is bigger than the width of the second component 420, and the first component 410 is adjacent to the antenna 211*a*. For example, the width of the first component 410 may be in a range of 300 micrometers (um) to 500 micrometers. The width of the second component 420 may be in a range of 200 um to 300 um. The thickness of the shielding structure 400 may be in a range of 60 um to 500 um. The shielding structure 400 can be used to shield the signal interference in a frequency range of 10 MHz to 12 GHz.

For example, the shielding structure 400 passes through the wiring layers 213 and 214 and the dielectric layers 222, 223 and 224, and is disposed between the wiring layers 212 and 215. The surface of the metal cover 250 is flush with the surface of the wiring layer 212, and the metal cover 250 may have a through hole 251, in which the dielectric layer 221 may directly touch the shielding structure 400 by the through hole 251. In the example of FIG. 2, the width of the first component 410 is 350 um, and the width of the second component 420 is 250 um, and the thickness of the shielding structure 400 is 210 um. The metal film 240 is connected to the ground planes of the wiring layers 214 and 215. When the total amount of the shielding structure 400 is 100 wt %, the usage amount of the composite material is 1 wt %, and the usage amount of the resin is 99 wt %.

It is necessary to explain that in the embodiment, the shielding structure 400 is disposed in the wiring board 200 and adjacent to the top side of the wiring board 200, and extends to a core dielectric layer (i.e., the dielectric layer 224) of the wiring board 200, but the embodiments of the application are not limited thereto. The shielding structure 400 may also not extend to the dielectric layer 224. In addition, the shielding structure 400 may be disposed in the wiring board 200 and adjacent to the bottom side of the wiring board 200 and may extend to the core dielectric layer (i.e., the dielectric layer 224). Alternatively, the shielding structure 400 may be disposed in wiring board 200 and adjacent to the bottom side of the wiring board 200 but may not extend to the dielectric layer 224. Specially, density of the shielding structure 400 is higher to be disposed where density of the wiring board 200 is lower (e.g., where metals are less in the wiring layers 211~218), so that overall density of the circuit board assembly 100A is relative average to helpfully lower differences of amounts of thermal expansion between the wiring layers 211~218 and the dielectric layers 221~227 in the wiring board 200, thereby decreasing the circuit board assembly 100A warping.

Referring to FIGS. 1 and 2, the wiring board 200 further includes multiple conductive pillars 260. The conductive pillars 260 are disposed in the wiring board 200 and surround the shielding area 201. That is, the conductive pillars 260 surround the antenna 211*a* and the chip 300. Each of the conductive pillars 260 is connected between the wiring layer 211 (i.e., a first wiring layer) and the wiring layer 212 (i.e., one of second wiring layers adjacent to the first wiring layer), or between adjacent two of the wiring layers 212~218 (i.e., adjacent two of the second wiring layers). The conductive pillars 260 are used to shield the signal interference between components in the shielding area 201 (e.g., the antenna 211*a* and the chip 300) and components out of the shielding area 201.

Figure 4:
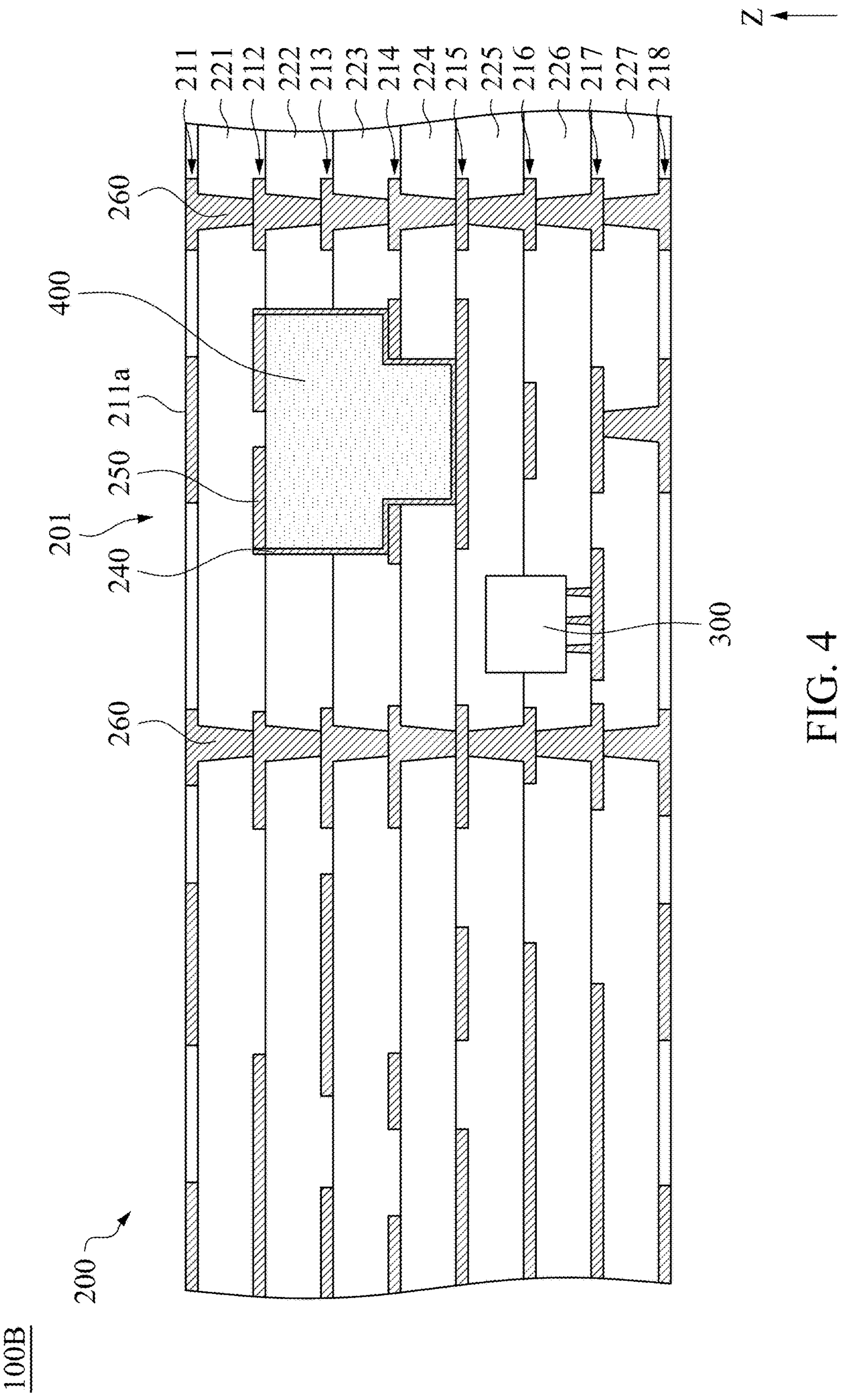
FIG. 4 is a partial cross-sectional schematic diagram of a circuit board assembly according to another embodiment of the application.

FIG. 4 is a partial cross-sectional schematic diagram of a circuit board assembly 100B according to another embodiment of the application. Referring to FIG. 4, the circuit board assembly 100B is similar to the circuit board assembly 100A in FIG. 2, and the difference between the circuit board assembly 100B and the circuit board assembly 100A is that the chip 300 of the circuit board assembly 100B is embedded in the wiring board 200. For example, the antenna 211*a* is located on top side of the shielding structure 400, and the chip 300 may be inside the wiring board 200, and a vertical projection of the chip 300 and the vertical projection of the antenna 211*a* may overlap or may not overlap, in which the signal transmissions between the chip 300 embedded in the wiring board 200 and the antenna 211*a* are not affected. Furthermore, the chip 300 and the antenna 211*a* are also located on different sides of the shielding structure 400, and the shielding structure 400 also shields the signal interference between the chip 300 and the antenna 211*a*. In addition, a phase change material (not shown) may be disposed around the chip 300, and the chip 300 achieves good dissipation of heat.

Figure 5:
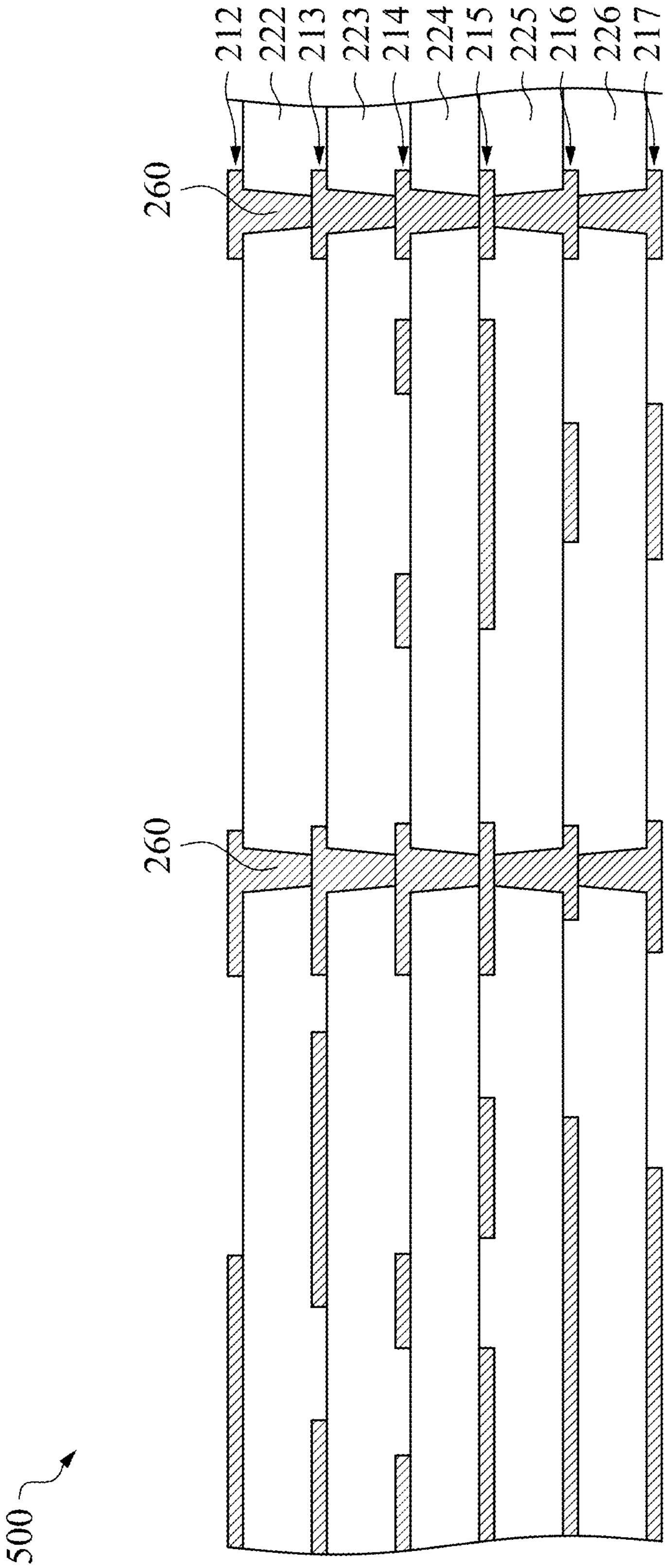
FIG. 5 is a partial cross-sectional schematic diagram of a step of providing a wiring substrate of a fabricating method of the circuit board assembly in FIG. 2.

FIG. 5 is a partial cross-sectional schematic diagram of a step of providing a wiring substrate 500 of a fabricating method of the circuit board assembly 100A in FIG. 2. Referring to FIG. 5, the wiring substrate 500 is provided, in which the wiring layers 212~217 and the dielectric layers 222~226 in the wiring substrate 500 are in stacks. The wiring substrate 500 may be made of a core substrate by stacking with buildup process. During this process, drilled holes may be formed among the wiring layers 212~217 by a laser drilling process, and the conductive pillars 260 may be further formed in the drilled holes by an electroless plating process or an electroplating process. Specially, when the wiring layers 212~217 are patterned, metal may be removed from locations where the shielding structure 400 will then be placed.

Figure 6:
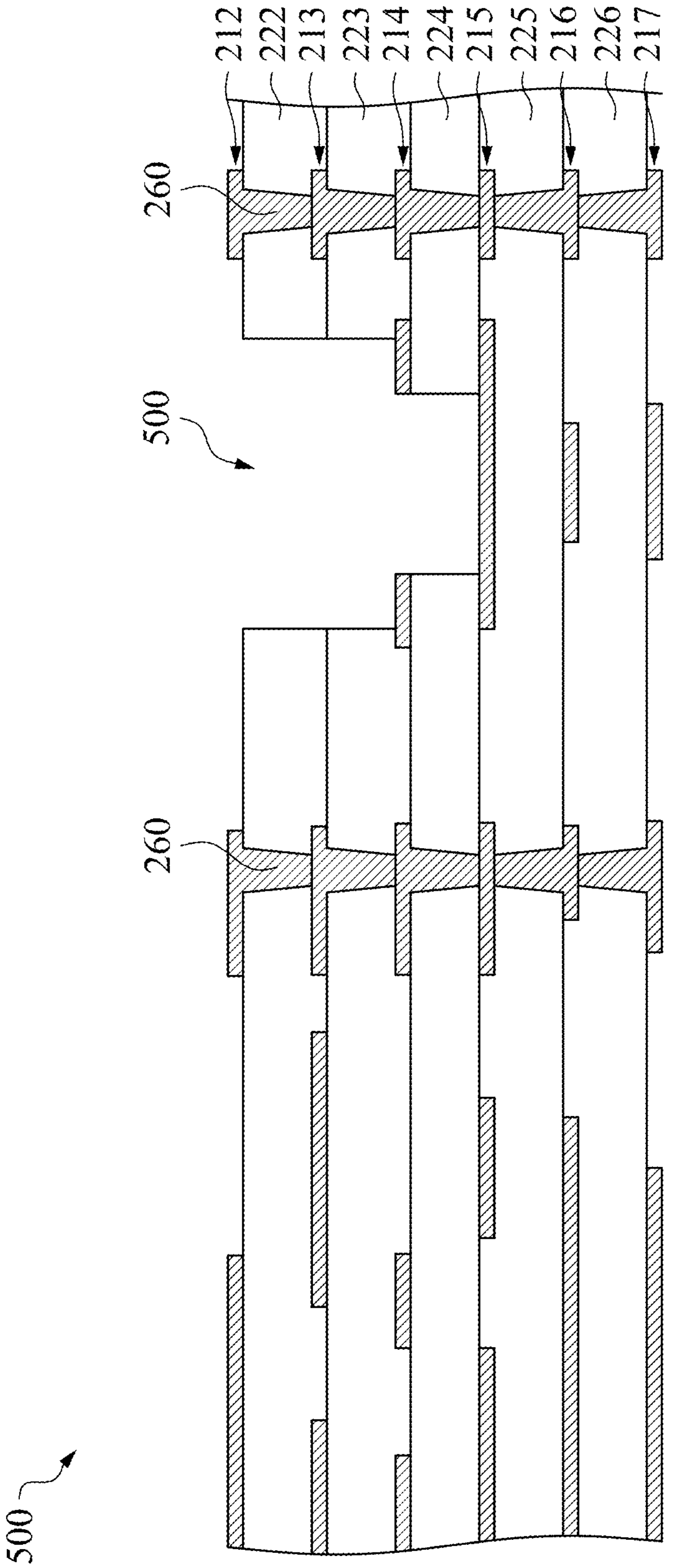
FIG. 6 is partial cross-sectional schematic diagrams of a step of forming a space of the fabricating method of the circuit board assembly in FIG. 2.
Figure 7:
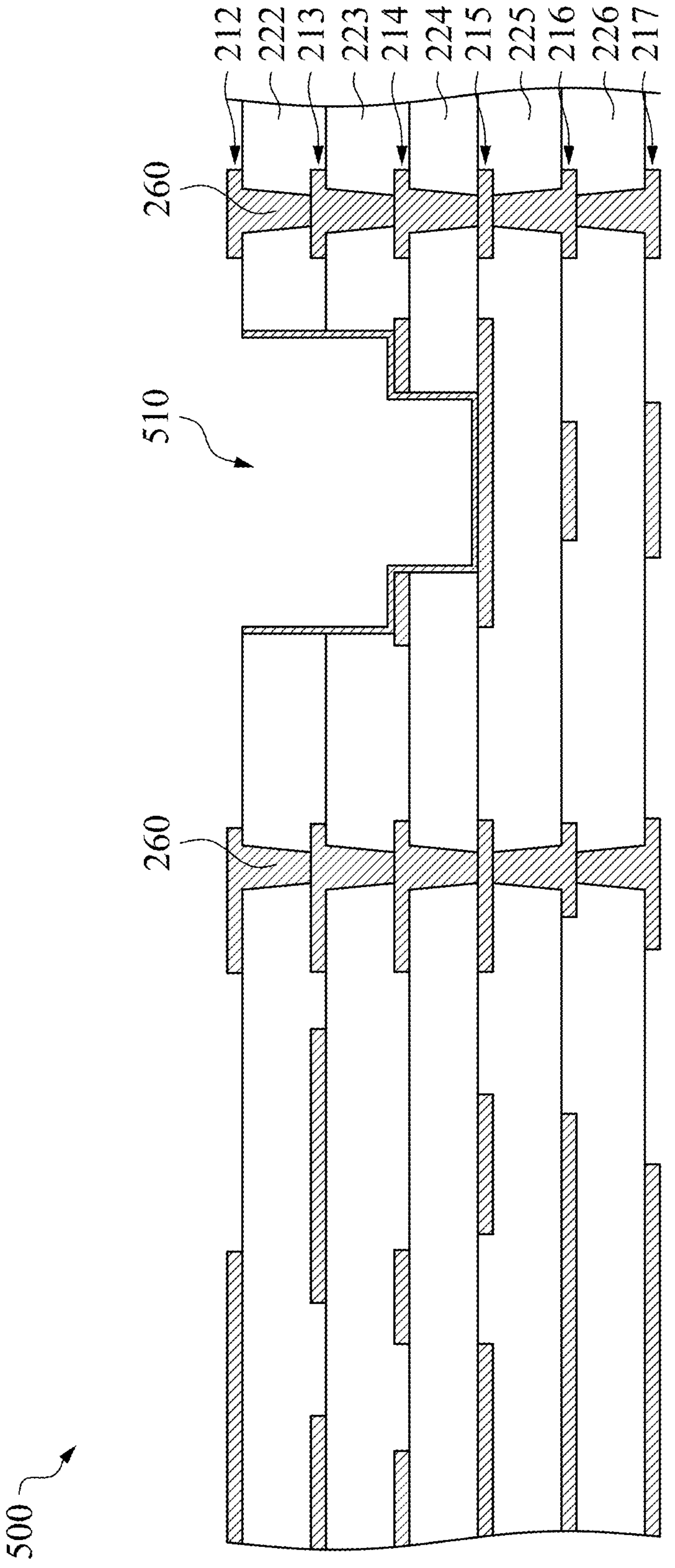
FIG. 7 is partial cross-sectional schematic diagram of a step of forming a metal film of the fabricating method of the circuit board assembly in FIG. 2.

FIGS. 6 and 7 are respectively partial cross-sectional schematic diagrams of steps of forming the space 510 and the metal film 240 of the fabricating method of the circuit board assembly 100A in FIG. 2. Referring to FIG. 6, the wiring substrate 500 is machined to form the space 510 that is extended through the wiring layers 213 and 214 and the dielectric layers 222, 223, 224, in which the shape of the space 510 may correspond to the shape of the shielding structure 400 and may be any suitable shape. Referring to FIG. 7, then, the metal film 240 is formed on an inner surface that defines the space 510. The metal film 240 may touch the ground planes in the wiring layers 212~217 (e.g., the ground planes in the wiring layers 214 and 215) but may not touch other traces in the wiring layers 212~217. The metal film 240 may be formed by the electroplating process.

Figure 8:
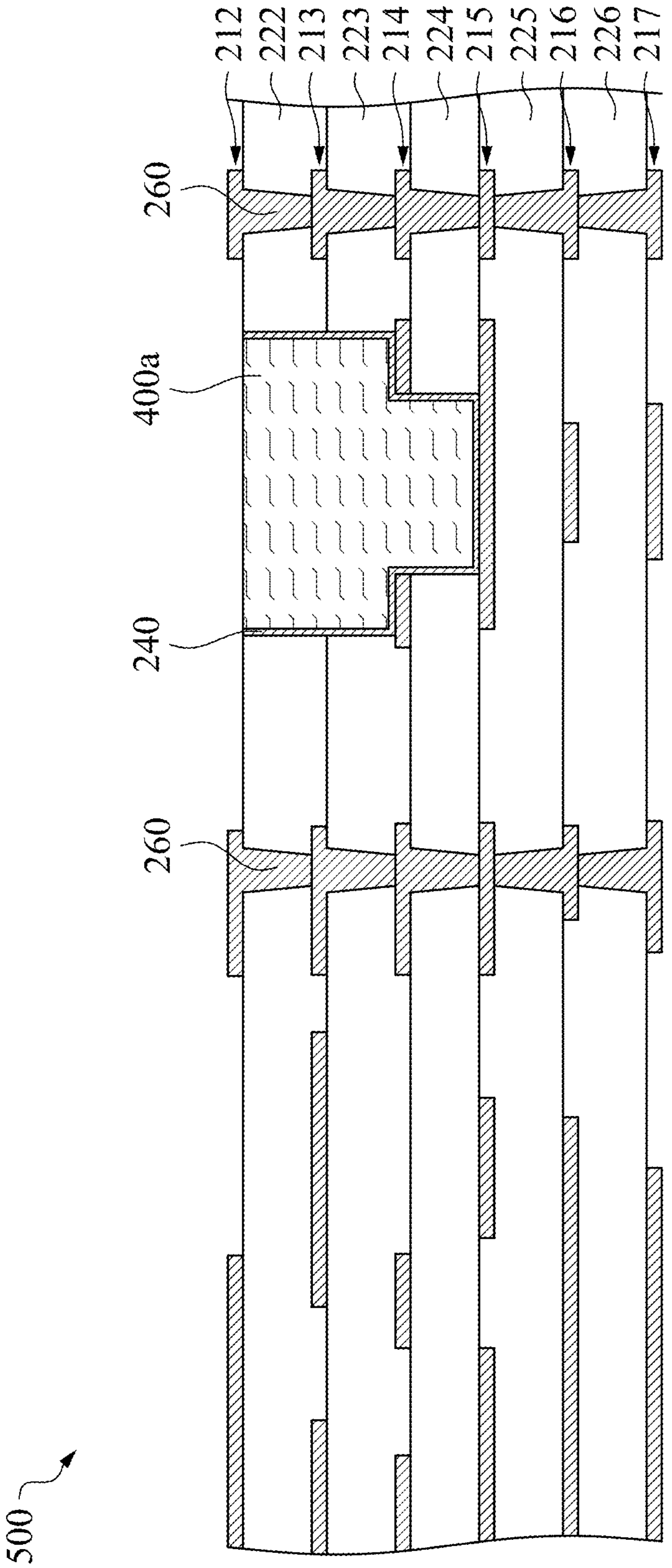
FIG. 8 is a partial cross-sectional schematic diagram of a step of forming a shielding structure of the fabricating method of the circuit board assembly in FIG. 2.

FIG. 8 is a partial cross-sectional schematic diagram of a step of forming the shielding structure 400 of the fabricating method of the circuit board assembly 100A in FIG. 2. Referring to FIGS. 7 and 8, a shielding material 400*a* is disposed in the space 510, so that the space 510 is filled with the shielding material 400*a* and the shielding material 400*a* touches the metal film 240, in which the shielding material 400*a* is formed by composite material particles (e.g., in a powdery state) and a resin liquid with uniform mixing. The shielding material 400*a* is filled into the space 510 in a liquid form.

Then, the shielding material 400*a* is heated so that the shielding material 400*a* solidifies to form the shielding structure 400. The heating temperature may be in a range of 50 degrees to 150 degrees Celsius. There is a correlation between the heating temperature and a proportion of the composite material and the resin in the shielding material 400*a*. For example, the more the composite material is used, the higher the heating temperature is; the less the composite material is used, the lower the heating temperature is. In addition, the process of forming the shielding structure 400 may be performed in a vacuum environment.

Figure 9:
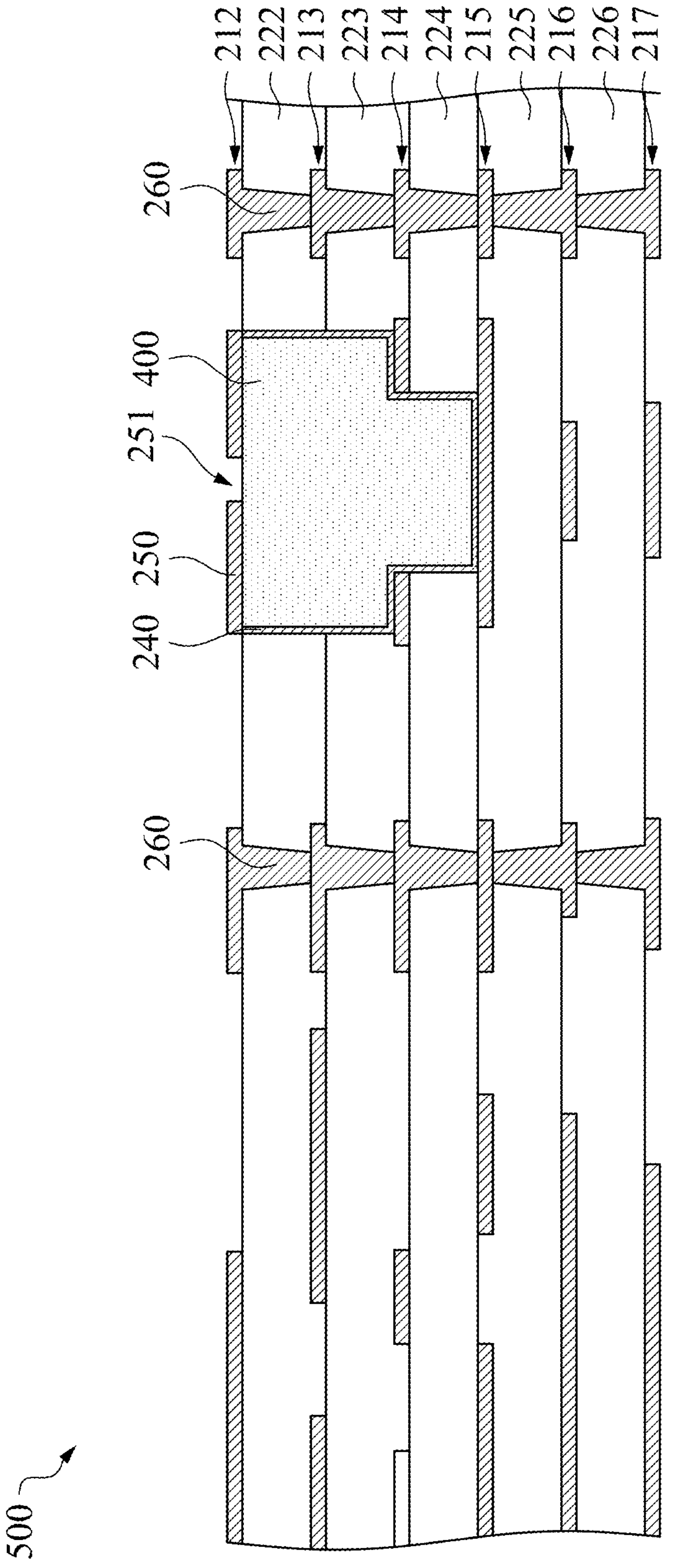
FIG. 9 is a partial cross-sectional schematic diagram of a step of disposing a metal cover of the fabricating method of the circuit board assembly in FIG. 2.

FIG. 9 is a partial cross-sectional schematic diagram of a step of disposing the metal cover 250 of the fabricating method of the circuit board assembly 100A in FIG. 2. Referring to FIG. 9, the metal cover 250 is disposed to cover the shielding structure 400, in which the metal cover 250 may touch the metal film 240 and the shielding structure 400. The metal cover 250 does not touch traces forming signal paths in the wiring layer 212. The metal cover 250 may be a metal plate or a metal layer, in which the metal plate is shaped before disposed and the metal layer is generated by the electroplating process at the moment, but the embodiments of the application are not limited thereto. Specially, the metal cover 250 has the through hole 251, so that the gas in the shielding structure 400 is exhausted from the through hole 251 easily.

Figure 10:
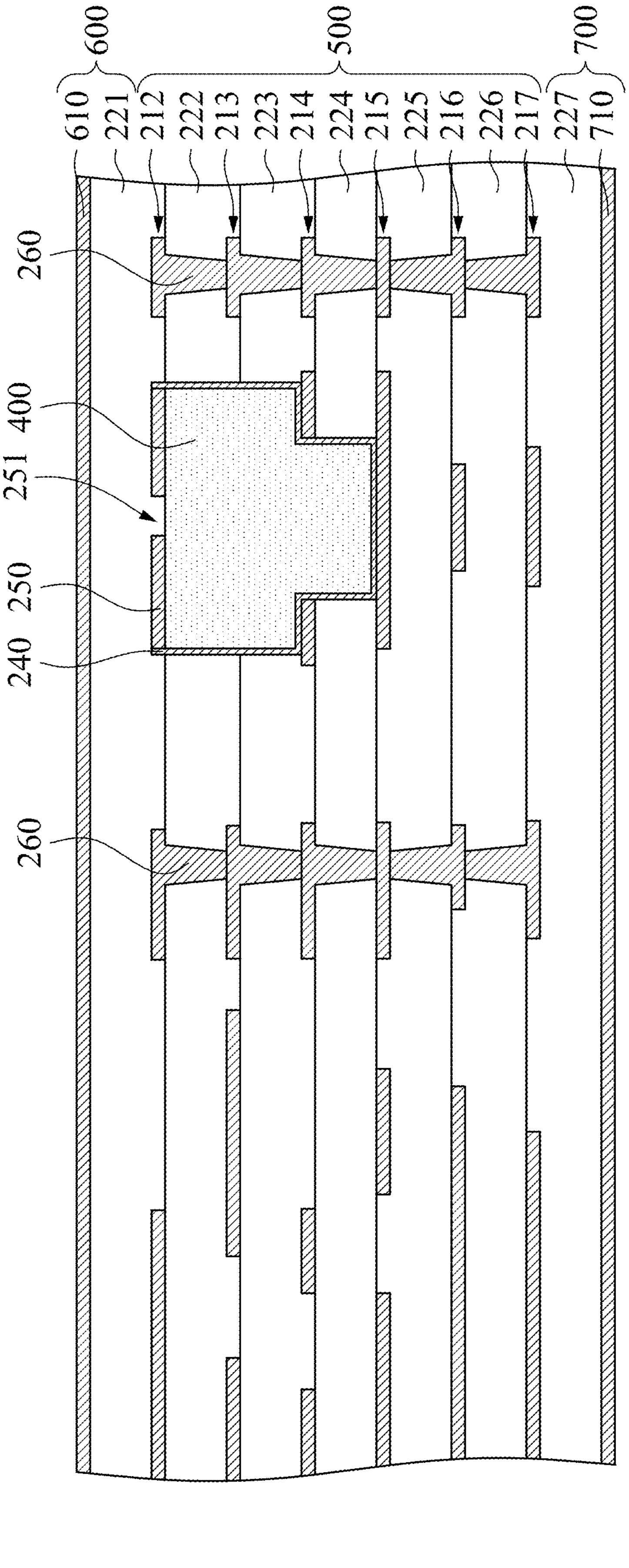
FIG. 10 is a partial cross-sectional schematic diagram of a laminating step of the fabricating method of the circuit board assembly in FIG. 2.

FIG. 10 is a partial cross-sectional schematic diagram of a laminating step of the fabricating method of the circuit board assembly 100A in FIG. 2. Referring to FIG. 10, at first, two metal substrates 600 and 700 are provided. The metal substrate 600 includes a metal layer 610 and the dielectric layer 221 in stacks. The metal substrate 700 includes a metal layer 710 and the dielectric layer 227 in stacks. Then, the wiring substrate 500 and the metal substrates 600 and 700 are combined by a laminating and heating process, in which the metal substrate 600 is located on top side of the wiring substrate 500, and the dielectric layer 221 faces the metal cover 250, while the metal substrate 700 is located on bottom side of the wiring substrate 500, and the dielectric layer 227 faces the metal cover 250. Before the metal substrate 600 is stacked, the gas in the shielding structure 400 can be exhausted from the through hole 251.

Figure 11:
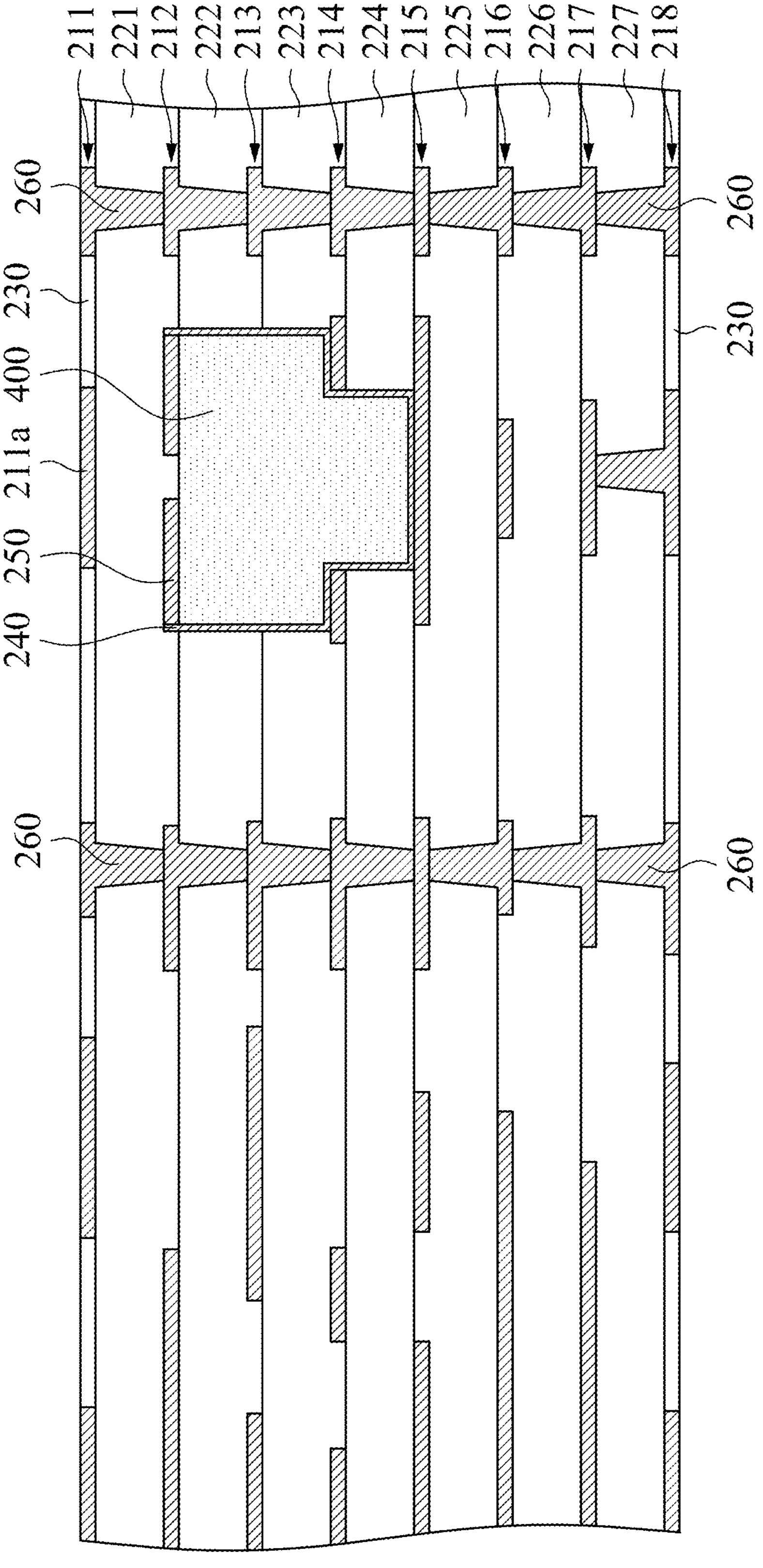
FIG. 11 is a partial cross-sectional schematic diagram of a step of forming an antenna of the fabricating method of the circuit board assembly in FIG. 2.

FIG. 11 is a partial cross-sectional schematic diagram of a step of forming the antenna 211*a* of the fabricating method of the circuit board assembly 100A in FIG. 2. Referring to FIGS. 10 and 11, the metal layer 610 is patterned to form the wiring layer 211, and the wiring layer 211 includes the antenna 211*a*. The metal layer 710 is patterned to form the wiring layer 218. The conductive pillars 260 are also formed between the wiring layers 211 and 212 and between the wiring layers 217 and 218 by the laser drilling process and by the electroless plating or electroplating process. Then, the solder masks 230 are coated on surfaces of the wiring layers 211 and 218 and the dielectric layers 221 and 227 (i.e., exposed parts from the wiring layers 211 and 218), in which the solder masks 230 expose the chip pads and the component pads of the wiring layers 211 and 218. Then, the chip 300 and the electronic components are mounted on the wiring layers 211 and 218 to complete the fabrication of the circuit board assembly 100A (as shown in FIG. 2).

It is worth mentioning that a fabricating method of the circuit board assembly 100B in FIG. 4 is similar to the fabricating method of the circuit board assembly 100A in FIG. 2, and the difference between the fabricating methods is that, in fabricating the circuit board assembly 100B, in the step of providing the wiring substrate 500 (in FIG. 5), the chip 300 has been embedded in the wiring substrate 500. It is necessary to explain that the process of electroplating the wiring substrate 500 to form the metal film 240 (as shown in FIG. 7) does not affect the chip 300 since the chip 300 is deep embedded in the wiring substrate 500. In addition, orders of the process of embedding the chip 300 in the wiring board 200 and the process of forming the shielding structure 400 can be decided according to the configurations of the chip 300 and the shielding structure 400 in the wiring board 200, but the embodiments of the application are not limited thereto.

Consequently, in the circuit board assemblies 100A and 100B disclosed from above embodiments, the shielding structures 400 may be used for shielding the signal interference between the antenna 211*a* and the chip 300 or between the antenna 211*a* and other electronic components, and obtain better shielding effects than an air cavity, thereby enhancing the signal transmission of the antennas 211*a*. In addition, the materials of the shielding structures 400 are helpful to the wiring boards 200 for the dissipation of heat. Further, the configurations of the shielding structures 400 may average overall densities of the circuit board assemblies 100A and 100B, thereby decreasing the circuit board assemblies 100A and 100B warping. The processes of manufacturing the shielding structures 400 do not require precise alignment, so that the processes are easier to perform.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board assembly, comprising:
- a wiring board comprising a dielectric layer, a first wiring layer, a metal film and a metal cover, wherein the first wiring layer comprising an antenna; and
- a shielding structure disposed in the wiring board, wherein the metal film covers a part of the shielding structure, and the metal cover touches the metal film and covers another part of the shielding structure not covered by the metal film,
- wherein the dielectric layer and the first wiring layer are in stacks while the dielectric layer is located on one side of the shielding structure,
- wherein a material of the shielding structure comprises carbon nanotube, metal and resin while the carbon nanotube and the metal are distributed in the resin,
- wherein a vertical projection of the antenna and a vertical projection of the shielding structure overlap.

2. The circuit board assembly of claim 1, wherein the metal cover has a through hole, wherein the dielectric layer directly touches the shielding structure by the through hole.

3. The circuit board assembly of claim 1, wherein the shielding structure comprises a first component and a second component, wherein the first component and the second component are in stacks, and a width of the first component is different from a width of the second component.

4. The circuit board assembly of claim 3, wherein the width of the first component is bigger than the width of the second component, and the first component is adjacent to the antenna.

5. The circuit board assembly of claim 1, wherein the wiring board further comprises:
- a plurality of second wiring layers and the first wiring layer in stacks, wherein the dielectric layer is stacked between the first wiring layer and one of the second wiring layers, and the shielding structure passes through at least two of the second wiring layers; and
- a plurality of conductive pillars disposed in the wiring board and surrounding the antenna, wherein each of the conductive pillars is connected between the first wiring layer and the one of the second wiring layers adjacent to the first wiring layer, or is connected between adjacent two of the second wiring layers.

6. The circuit board assembly of claim 1, further comprising:
- a chip mounted on the wiring board, wherein the chip and the antenna are respectively located on different sides of the shielding structure.

7. The circuit board assembly of claim 6, wherein the chip and the antenna are respectively located on two opposite sides of the shielding structure.

8. The circuit board assembly of claim 6, wherein the chip is embedded in the wiring board.

9. The circuit board assembly of claim 1, wherein the material of the shielding structure further comprises ceramic material, wherein the ceramic material, the carbon nanotube and the metal are distributed in the resin.

10. A fabricating method of a circuit board assembly, comprising:
- providing a wiring substrate;
- forming a space in a surface of the wiring substrate;
- forming a metal film on an inner surface that defines the space;
- forming a shielding structure in the space;
- disposing a metal cover to cover the shielding structure;
- providing a metal substrate, wherein the metal substrate comprises a dielectric layer and a metal layer in stacks;
- combining the wiring substrate and the metal substrate, wherein the dielectric layer faces the metal cover; and
- patterning the metal layer to form an antenna, wherein a vertical projection of the antenna and a vertical projection of the shielding structure overlap;
- wherein a step of forming the shielding structure in the space comprises:
- filling the space with a shielding material, wherein the shielding material is in a liquid form and touches the metal film; and
- heating the shielding material so that the shielding material solidifies to form the shielding structure; and
- wherein the shielding material comprises carbon nanotube, metal and resin.

11. The fabricating method of claim 10, further comprising:
- mounting a chip on a wiring layer of the wiring substrate, wherein the wiring layer and the shielding structure are respectively located on two opposite sides of the wiring substrate.

12. The fabricating method of claim 10, wherein the shielding material further comprises ceramic material.

13. The fabricating method of claim 10, further comprising:

forming a plurality of drilled holes in the metal substrate after combining of the wiring substrate and the metal substrate; and forming a plurality of conductive pillars in the drilled holes.

14. The fabricating method of claim 10, wherein a thickness of the shielding structure is in a range of 60 um to 500 um.

15. The fabricating method of claim 10, wherein the shielding structure is made of a composite material and a resin;

wherein when a total amount of the shielding structure is 100 wt %, an amount of the composite material is between 0.1 wt % and 20 wt %, and an amount of the resin is between 80 wt % and 99 wt %.

16. The fabricating method of claim 15, wherein the composite material comprises carbon nanotube and metal.

* * * * *